(12) United States Patent
Park et al.

(10) Patent No.: US 10,419,159 B2
(45) Date of Patent: *Sep. 17, 2019

(54) LOW DENSITY PARITY CHECK ENCODER, AND LOW DENSITY PARITY CHECK ENCODING METHOD USING THE SAME

(71) Applicant: ELECTRONICS AND TELECOMMUNICATIONS RESEARCH INSTITUTE, Daejeon (KR)

(72) Inventors: Sung-Ik Park, Daejeon (KR); Heung-Mook Kim, Daejeon (KR); Sun-Hyoung Kwon, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 83 days.

This patent is subject to a terminal disclaimer.

(21) Appl. No.: 15/426,913

(22) Filed: Feb. 7, 2017

(65) Prior Publication Data

US 2017/0149530 A1    May 25, 2017

Related U.S. Application Data

(63) Continuation of application No. 14/495,821, filed on Sep. 24, 2014, now Pat. No. 9,602,243.

(30) Foreign Application Priority Data

Aug. 26, 2014  (KR) .................. 10-2014-0111764
Sep. 3, 2014  (KR) .................. 10-2014-0116872

(51) Int. Cl.
*H04L 1/00*   (2006.01)
*H03M 13/11*  (2006.01)
(Continued)

(52) U.S. Cl.
CPC ........ *H04L 1/0042* (2013.01); *H03M 13/036* (2013.01); *H03M 13/1165* (2013.01);
(Continued)

(58) Field of Classification Search
CPC ... H04L 1/0042; H04L 1/0058; H04L 1/0057; H04L 1/0071; H04L 1/0041;
(Continued)

(56) References Cited

U.S. PATENT DOCUMENTS 6,408,418 B1 *  6/2002  Bl ........................ H03M 13/39
                                          714/786
9,450,611 B2 *  9/2016  Park ................... H03M 13/1177
(Continued)

FOREIGN PATENT DOCUMENTS

CA       2940275 A1       8/2015
KR    10-2007-0058438 A   6/2007
(Continued)

OTHER PUBLICATIONS

ETSI, Digital Video Broadcasting (DVB); Frame structure channel coding and modulation for a second generation digital terrestrial television broadcasting system (DVB-T2), Oct. 2010, European Standard (Telecommunications series), v1.2.1, pp. 37-38 (Year: 2010).*

(Continued)

*Primary Examiner* — April Y Blair
*Assistant Examiner* — Sazzad Hossain

(57) ABSTRACT

A low density parity check (LDPC) encoder, an LDPC decoder, and an LDPC encoding method are disclosed. The LDPC encoder includes first memory, second memory, and a processor. The first memory stores an LDPC codeword. The second memory is initialized to 0. The processor generates the LDPC codeword by performing accumulation with respect to the second memory using information bits.

(Continued)

The accumulation is performed at parity bit addresses that are updated using a sequence corresponding to a parity check matrix (PCM).

6 Claims, 5 Drawing Sheets

(51) Int. Cl.
*H03M 13/03* (2006.01)
*H03M 13/31* (2006.01)
*H03M 13/00* (2006.01)
*H03M 13/25* (2006.01)
*H03M 13/27* (2006.01)
*H03M 13/29* (2006.01)
*H04L 27/26* (2006.01)

(52) U.S. Cl.
CPC ....... *H03M 13/1185* (2013.01); *H03M 13/31* (2013.01); *H03M 13/6502* (2013.01); *H04L 1/0057* (2013.01); *H04L 1/0058* (2013.01); *H04L 1/0071* (2013.01); *H03M 13/1102* (2013.01); *H03M 13/116* (2013.01); *H03M 13/1148* (2013.01); *H03M 13/255* (2013.01); *H03M 13/27* (2013.01); *H03M 13/2921* (2013.01); *H04L 1/0041* (2013.01); *H04L 27/2627* (2013.01)

(58) Field of Classification Search
CPC .............. H04L 27/2627; H03M 13/31; H03M 13/6502; H03M 13/1102; H03M 13/1165; H03M 13/255; H03M 13/27; H03M 13/036; H03M 13/116; H03M 13/1148; H03M 13/1168; H03M 13/1185; H03M 13/2921
See application file for complete search history.

(56) References Cited

U.S. PATENT DOCUMENTS

| | | | | |
|---|---|---|---|---|
| 9,479,289 B2* | 10/2016 | Park | ................ | H04L 1/0057 |
| 9,489,259 B2* | 11/2016 | Park | ................ | H03M 13/1102 |
| 9,489,262 B2* | 11/2016 | Park | ................ | H03M 13/1102 |
| 9,490,843 B2* | 11/2016 | Park | ................ | H03M 13/1177 |
| 9,490,846 B2* | 11/2016 | Park | ................ | H04L 1/0057 |
| 9,496,896 B2* | 11/2016 | Park | ................ | H03M 13/1102 |
| 9,525,432 B2* | 12/2016 | Park | ................ | H03M 13/1102 |
| 9,602,243 B2* | 3/2017 | Park | ................ | H04L 1/0057 |
| 9,602,244 B2* | 3/2017 | Park | ................ | H04L 1/0057 |
| 9,729,172 B2* | 8/2017 | Park | ................ | H03M 13/1177 |
| 9,729,173 B2* | 8/2017 | Park | ................ | H04L 1/0057 |
| 9,735,807 B2* | 8/2017 | Park | ................ | H03M 13/1177 |
| 9,735,808 B2* | 8/2017 | Park | ................ | H03M 13/1102 |
| 9,800,266 B2* | 10/2017 | Park | ................ | H03M 13/1102 |
| 2008/0178065 A1 | 7/2008 | Khandekar et al. | | |
| 2013/0145231 A1* | 6/2013 | Frayer | ................ | H03M 13/13 714/763 |
| 2014/0157079 A1 | 6/2014 | Park et al. | | |
| 2017/0012647 A1* | 1/2017 | Park | ................ | H04L 1/0057 |
| 2017/0054451 A1* | 2/2017 | Park | ................ | H03M 13/1102 |
| 2017/0149447 A1* | 5/2017 | Park | ................ | H04L 1/0057 |
| 2018/0006663 A1* | 1/2018 | Park | ................ | H03M 13/1102 |

FOREIGN PATENT DOCUMENTS

| | | |
|---|---|---|
| KR | 10-2013-0135746 A | 12/2013 |
| WO | WO 2006/001666 A2 | 1/2006 |

OTHER PUBLICATIONS

Yiyan Wu et al., "Cloud Transmission: A New Spectrum-Reuse Friendly Digital Terrestrial Broadcasting Transmission System", IEEE Transactions on Broadcasting, Sep. 2012, pp. 329-337, vol. 58, No. 3.
"Digital Video Broadcasting (DVB); Frame structure channel coding and modulation for a second generation digital terrestrial television broadcasting system (DVB-T2)," Final draft ETSI EN 302 755, Oct. 2010, pp. 1-177, V1.2.1, ETSI, http://www.etsi.org/deliver/etsi_en/302700_302799/302755/01.02.01_40/en_302755v010201o.pdf.
"Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Sep. 27, 2013, pp. 1-101, CRC Canada and ETRI Korea.
"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Oct. 21, 2013, pp. 1-138, CRC Canada and ETRI Korea.
"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Dec. 5, 2013, pp. 1-138, CRC Canada and ETRI Korea.

* cited by examiner

US 10,419,159 B2

LOW DENSITY PARITY CHECK ENCODER, AND LOW DENSITY PARITY CHECK ENCODING METHOD USING THE SAME

CROSS-REFERENCE TO RELATED APPLICATIONS

This application is a continuation of U.S. patent application Ser. No. 14/495,821, filed Sep. 24, 2014, which claims the benefit of Korean Patent Application Nos. 10-2014-0111764 and 10-2014-0116872, filed Aug. 26, 2014 and Sep. 3, 2014, respectively, which are hereby incorporated by reference herein in their entirety.

BACKGROUND

1. Technical Field

The present disclosure relates generally to a low density parity check (LDPC) code that is used to correct errors occurring over a wireless channel, and, more particularly, to an LDPC code that is applicable to a digital broadcasting system.

2. Description of the Related Art

Current terrestrial television (TV) broadcasting generates co-channel interference across an area within a distance that is three times a service radius, and thus the same frequency cannot be reused in the area within the distance that is three times the service radius. An area in which the same frequency cannot be reused is called a white space. Spectrum efficiency significantly deteriorates due to the occurrence of a white space.

Accordingly, there arises a need for the development of a transmission technology that facilitates the elimination of a white space and the reuse of a frequency with an emphasis on reception robustness in order to improve spectrum efficiency.

In response to this, the paper "Cloud Transmission: A New Spectrum-Reuse Friendly Digital Terrestrial Broadcasting Transmission System" published on September of 2012 in IEEE Transactions on Broadcasting, Vol. 58, No. 3 proposes a terrestrial cloud transmission technology that facilitates reuse, does not generate a white space, and makes the construction and operation of a single frequency network easy.

Using this terrestrial cloud transmission technology, a broadcasting station can transmit the same nationwide content or locally different content over a single broadcasting channel. However, for this purpose, a receiver should receive one or more terrestrial cloud broadcast signals in an area in which signals transmitted from different transmitters overlap each other, that is, an overlap area, over a single frequency network, and then should distinguish and demodulate the received terrestrial cloud broadcast signals. That is, the receiver should demodulate one or more cloud broadcast signals in a situation in which co-channel interference is present and the timing and frequency synchronization between transmitted signals are not guaranteed.

Meanwhile, Korean Patent Application Publication No. 2013-0135746 entitled "Low Density Parity Check Code for Terrestrial Cloud Transmission" discloses an LDPC code that is optimized for terrestrial cloud transmission and exhibits excellent performance at low code rate (<0.5).

However, Korean Patent Application Publication No. 2013-0135746 is directed to a code length completely different from an LDPC code length used in the DVB broadcast standard, etc., and does not teach a specific LDPC encoding method.

SUMMARY

At least one embodiment of the present invention is directed to the provision of a new LDPC codeword having a length of 64800 or 16200, which is capable of being used for general purposes.

At least one embodiment of the present invention is directed to the provision of a technology that is capable of efficiently updating parity bit addresses when generating the parity bits of an LDPC codeword through accumulation using a sequence corresponding to a PCM (parity check matrix).

At least one embodiment of the present invention is directed to the provision of a technology that is capable of updating parity bit addresses based on the results of comparing previous parity bit addresses with the size of a parity part corresponding to dual diagonal matrix included in a PCM when generating the parity bits of an LDPC codeword through accumulation using a sequence corresponding to a PCM, thereby improving the efficiency of LDPC encoding.

In accordance with an aspect of the present invention, there is provided an LDPC encoder, including first memory configured to store an LDPC codeword; second memory configured to be initialized to 0; and a processor configured to generate the LDPC codeword by performing accumulation with respect to the second memory using information bits.

The accumulation may be performed at parity bit addresses that are updated using a sequence corresponding to a PCM.

The LDPC codeword may include a systematic part corresponding to the information bits, a first parity part corresponding to a dual diagonal matrix included in the PCM, and a second parity part corresponding to an identity matrix included in the PCM.

The second memory may have a size corresponding to the sum of the size of the first parity part and the size of the second parity part.

The parity bit addresses may be updated based on the results of comparing each of previous parity bit addresses specified in each row of the sequence with the size of the first parity part.

The parity bit addresses may be updated in accordance with the following equation:

$(x+m \times Q_1) \bmod M_1$ if $x < M_1$ $M_1 + \{(x - M_1 + m \times Q_2) \bmod M_2\}$ if $x \geq M_1$ where x denotes the previous parity bit addresses, m is an information bit index that is an integer larger than 0 and smaller than L, L is the CPM size of the PCM, $Q_1$ is $M_1/L$, $M_1$ is the size of the first parity part, $Q_2$ is $M_2/L$, and $M_2$ is the size of the second parity part.

The accumulation may be performed while the rows of the sequence are being repeatedly changed by the CPM size of the PCM.

The first parity part may be generated by performing parity interleaving using the first and second memory.

The second parity part may be generated by performing parity interleaving using the first and second memory after the accumulation performed using the first parity part, which is generated by the parity interleaving, and the sequence.

In accordance with another aspect of the present invention, there is provided an LDPC encoding method, including initializing first memory configured to store an LDPC codeword, and second memory; and generating the LDPC codeword by performing accumulation with respect to the second memory using information bits.

The accumulation may be performed at parity bit addresses that are updated using a sequence corresponding to a PCM.

The LDPC codeword may include a systematic part corresponding to the information bits, a first parity part corresponding to a dual diagonal matrix included in the PCM, and a second parity part corresponding to an identity matrix included in the PCM.

The parity bit addresses may be updated based on the results of comparing each of previous parity bit addresses specified in each row of the sequence with the size of the first parity part.

The parity bit addresses may be updated in accordance with the above equation.

The accumulation may be performed while the rows of the sequence are being repeatedly changed by the CPM size of the PCM.

The first parity part may be generated by performing parity interleaving using the first and second memory.

The second parity part may be generated by performing parity interleaving using the first and second memory after the accumulation performed using the first parity part, which is generated by the parity interleaving, and the sequence.

In accordance with still another aspect of the present invention, there is provided an LDPC decoder, including a receiving unit configured to receive an LDPC codeword encoded using a sequence corresponding to a PCM; and a decoding unit configured to restore information bits from the received LDPC codeword by performing decoding corresponding to the PCM.

The sequence may be used to update the parity bit addresses of memory, and the parity bit addresses may be used for accumulation that is performed to generate parity bits corresponding to the LDPC codeword.

The LDPC codeword may include a systematic part corresponding to the information bits, a first parity part corresponding to a dual diagonal matrix included in the PCM, and a second parity part corresponding to an identity matrix included in the PCM.

The parity bit addresses may be updated based on the results of comparing each of previous parity bit addresses specified in each row of the sequence with the size of the first parity part.

The parity bit addresses may be updated in accordance with the above equation.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
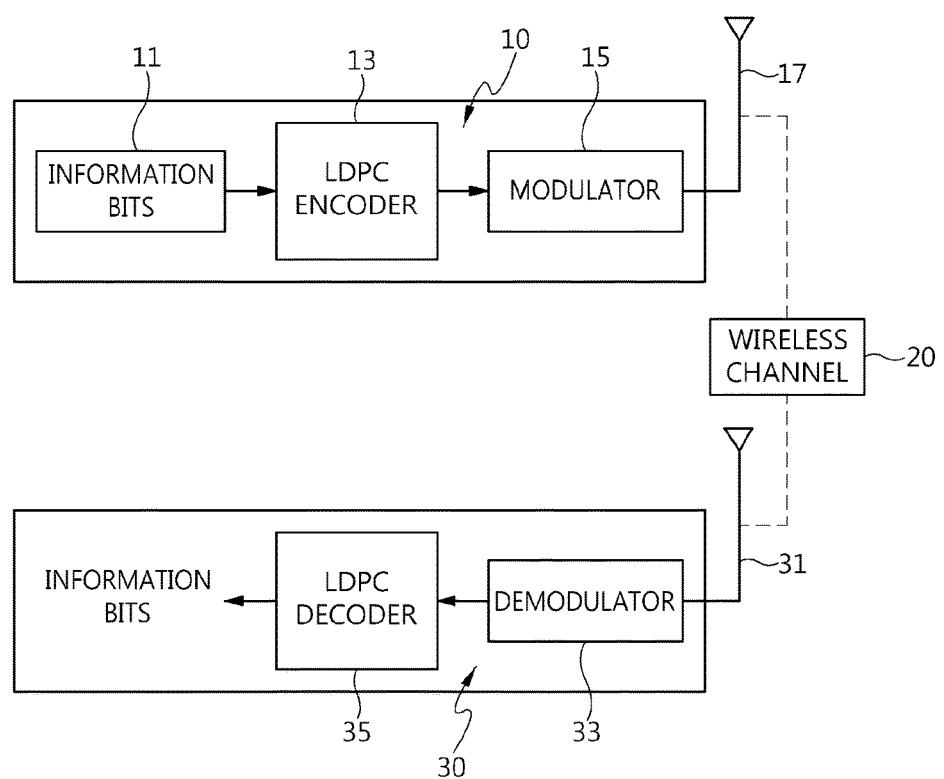
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a transmitter 10 and a receiver 30 communicate with each other over a wireless channel 20.

The transmitter 10 generates an n-bit codeword by encoding k information bits using an LDPC encoder 13. The codeword is modulated by the modulator 15, and is transmitted via an antenna 17. The signal transmitted via the wireless channel 20 is received via the antenna 31 of the receiver 30, and, in the receiver 30, is subjected to a process reverse to the process in the transmitter 10. That is, the received data is demodulated by a demodulator 33, and is then decoded by an LDPC decoder 35, thereby finally restoring the information bits.

It will be apparent to those skilled in the art that the above-described transmission and reception processes have been described within a minimum range required for a description of the features of the present invention and various processes required for data transmission may be added.

In the following, the specific processes of encoding and decoding that are performed using an LDPC code in the LDPC encoder 13 or LDPC decoder 35 and the specific configurations of encoding and decoding devices, such as the LDPC encoder 13 and the LDPC decoder 35, are described. The LDPC encoder 13 illustrated in FIG. 1 may have a structure illustrated in FIG. 4, and the LDPC decoder 35 may have a structure illustrated in FIG. 5.

Figure 2:
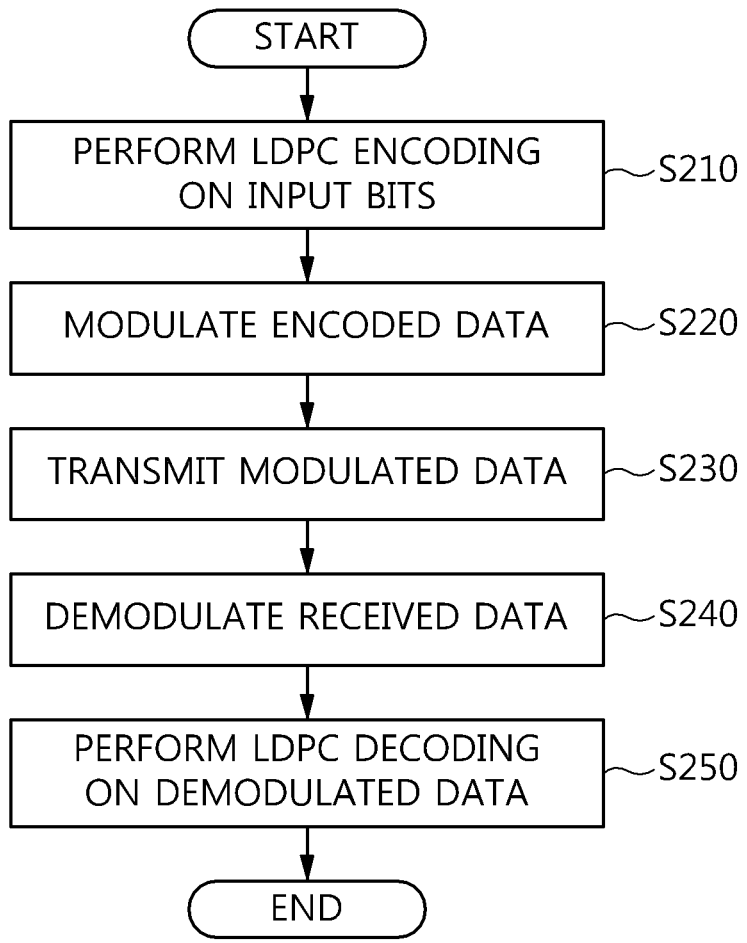
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to LDPC encoding at step S210.

That is, at step S210, an n-bit codeword is generated by encoding k information bits using the LDPC encoder.

Figure 6:
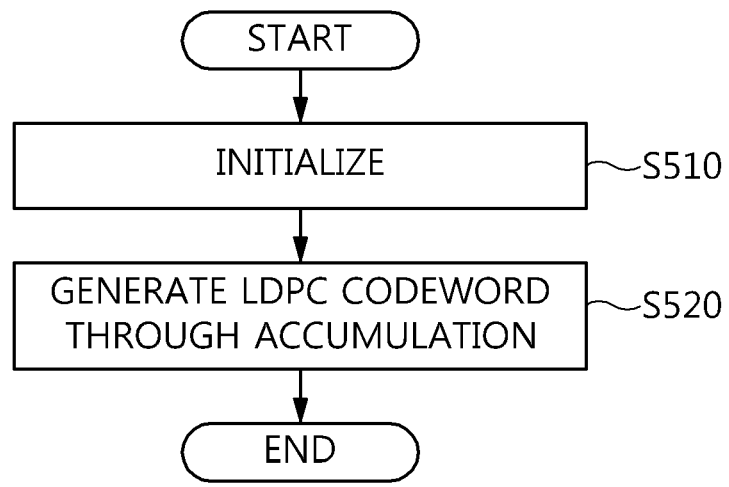
FIG. 6 is an operation flowchart illustrating an LDPC encoding method according to an embodiment of the present invention.

In this case, step S210 may be performed as in an LDPC encoding method illustrated in FIG. 6.

Furthermore, in the broadcast signal transmission and reception method, the encoded data is modulated at step S220.

That is, at step S220, the encoded n-bit codeword is modulated using the modulator.

Furthermore, in the broadcast signal transmission and reception method, the modulated data is transmitted at step S230.

That is, at step S230, the modulated codeword is transmitted over a wireless channel via the antenna.

Furthermore, in the broadcast signal transmission and reception method, the received data is demodulated at step S240.

That is, at step S240, the signal transmitted over the wireless channel is received via the antenna of the receiver, and the received data is demodulated using the demodulator.

Furthermore, in the broadcast signal transmission and reception method, the demodulated data is subjected to LDPC decoding at step S250.

That is, at step S250, the information bits are finally restored by performing LDPC decoding using the demodulator of the receiver.

Figure 5:
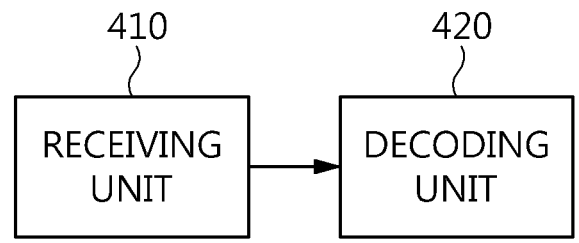
FIG. 5 is a block diagram illustrating an LDPC decoder according to an embodiment of the present invention.

In this case, step S250 corresponds to a process reverse to that of the LDPC encoding method illustrated in FIG. 6, and may correspond to the LDPC decoder of FIG. 5.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
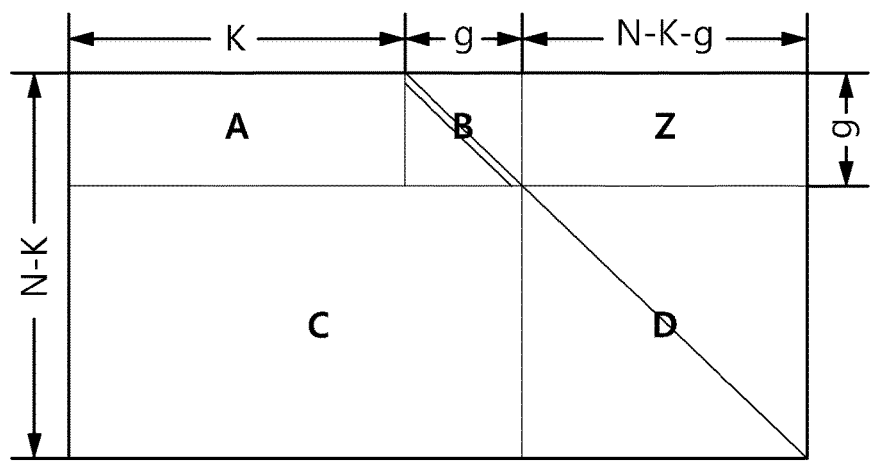
FIG. 3 is a diagram illustrating the structure of a PCM corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 1/15, 2/15, 3/15, 4/15, 5/15, 6/15, 7/15 and the length of a codeword is 16200 or 64800, as illustrated in the following Table 1.

Table 1 illustrates the sizes of the matrices A, B, C, D and Z of the QC-LDPC code according to the present invention:

TABLE 1

| Rate | Length | A | B | C | D | Z |
|------|--------|---|---|---|---|---|
| 1/15 | 16200 | 2520 × 1080 | 2520 × 2520 | 12600 × 3600 | 12600 × 12600 | 2520 × 12600 |
|      | 64800 | 1080 × 4320 | 1080 × 1080 | 59400 × 5400 | 59400 × 59400 | 1080 × 59400 |
| 2/15 | 16200 | 3240 × 2160 | 3240 × 3240 | 10800 × 5400 | 10800 × 10800 | 3240 × 10800 |
|      | 64800 | 1800 × 8640 | 1800 × 1800 | 54360 × 10440 | 54360 × 54360 | 1800 × 54360 |
| 3/15 | 16200 | 1080 × 3240 | 1080 × 1080 | 11880 × 4320 | 11880 × 11880 | 1080 × 11880 |
|      | 64800 | 1800 × 12960 | 1800 × 1800 | 50040 × 14760 | 50040 × 50040 | 1800 × 50040 |
| 4/15 | 16200 | 1080 × 4320 | 1080 × 1080 | 10800 × 5400 | 10800 × 10800 | 1080 × 10800 |
|      | 64800 | 1800 × 17280 | 1800 × 1800 | 45720 × 19080 | 45720 × 45720 | 1800 × 45720 |
| 5/15 | A 16200 | 1080 × 5400 | 1080 × 1080 | 9720 × 6480 | 9720 × 9720 | 1080 × 9720 |
|      | B 16200 | 720 × 5400 | 720 × 720 | 10080 × 6120 | 10080 × 10080 | 720 × 10080 |
|      | 64800 | 1440 × 21600 | 1440 × 1440 | 41760 × 23040 | 41760 × 41760 | 1080 × 41760 |
| 6/15 | 16200 | 1080 × 6480 | 1080 × 1080 | 8640 × 7560 | 8640 × 8640 | 1080 × 8640 |
|      | 64800 | 1080 × 25920 | 1080 × 1080 | 37800 × 27000 | 37800 × 37800 | 1080 × 37800 |
| 7/15 | 16200 | 1080 × 7560 | 1080 × 1080 | 7560 × 8640 | 7560 × 7560 | 1080 × 7560 |
|      | 64800 | 1080 × 30240 | 1080 × 1080 | 33480 × 31320 | 33480 × 33480 | 1080 × 33480 |

The newly designed LDPC code may be represented in the form of a sequence (progression), an equivalent relationship is established between the sequence and matrix (parity bit check matrix), and the sequence may be represented by 15 embodiments, as follows:

Embodiment 1

Code Rate (R)=1/15, Length (N)=16200, L=360
398 1743 2278 2651 2787 6779 9430 11470 11569 13047
212 462 508 3160 5813 6802 7847 9610 13671 14504
187 1198 1502 3605 5601 7425 11206 11274 11894 14186
5574 8577 9343 11146 12403 12876 13435
3348 4033 4302 5214 5233 5652 10703
3001 3697 6920 9835 10610 11272 12752
7730 7964 9943 11101 11323 14469 14874
3136 6453 8777 10808 11579 12598 12644
2613 4826 5305 12146 12996 14961 14995
5890 8404 10962 11313 12687 13577 15004

Embodiment 2

Code Rate (R)=1/15, Length (N)=64800, L=360
245 687 1000 2777 3315 4095 5501 5872 7390 9149 9539 9617 13754 14644 14799 23086 25387 27239 29801 32373 35886 38167 39216 39340 44336 45731 46204 47334 52372 52383 53521 57355 57604 57815
380 408 952 3613 3632 4473 7159 7826 8897 12245 14877 21670 24074 24383 25152 25803 25806 29008 29960 29997 31728 32613 36117 37517 40313 47030 47509 48092 48176 50979 52971 55604 56048 59940
151 369 998 1681 3441 6066 7231 9000 9490 13805 16955 18705 20711 27048 31198 31690 32218 35780 36357 37947 38088 38778 38962 42119 43177 44182 46117 47222 53828 54044 56646 56772 57500 59682
117 220 551 3631 6692 7498 7597 7735 8183 10260 11342 12890 13254 16859 17101 18517 19846 22984 25173 28702 39028 44262 44873 45392 46991 47603 50086 51519 53701 53724 54239 55933 56760 58185
330 472 653 1262 6955 7354 8273 8524 9969 9975 10018 13645 17053 17281 18293 19156 19341 22543 22761 26276 31555 32698 34092 34810 39519 40328 40669 43594 43871 46020 48023 48300 51504 57140
134 199 684 3969 7160 12364 14983 15102 15382 15484 19988 20240 21579 21884 22382 22593 29532 30400 33618 34911 37742 38116 43069 46088 47625 48356 49033 50752 53550 57936 59968 60238 60380 60431
307 374 495 1921 7797 7868 8394 9640 10529 11942 14233 16246 19334 24441 28034 29394 32571 34516 35327 36056 37096 37972 38526 39824 42198 42234 42662 49933 51012 51033 53049 53217 53443 59284
191 714 805 1652 2340 2530 2544 2646 4365 5938 6415 7068 9641 9958 13660 15296 23328 24610 24848 28622 29458 30121 32614 37246 38547 42095 42575 43668 43851 46329 49556 52958 56939 58244
118 320 519 1388 1517 3274 5115 5592 6219 8864 10154 10275 11759 18515 19027 19032 20044 20445 24390 27710 36234 40833 41737 43983 47149 47680 51801 52861 55096 55514 56456 57878 58834 59269
356 592 948 2329 4537 6280 6321 9025 9950 10994 13155 13508 15291 15821 17501 19872 20139 21465 26116 26934 27932 31317 31676 32302 32517 34746 36501 38051 38182 41697 47661 49307 50272 53270
146 148 186 1503 1634 3365 4277 5215 6143 6378 13591 13655 23776 24624 24922 26155 29919 31249 33503 34070 35433 36498 37089 39883 40025 40098 41557 43641 45862 45870 46001 51732 57338 59955
503 802 879 1915 3959 5795 6715 8288 8411 9222 12074 12087 15215 15484 17902 19019 19745 21957 22756 22990 26541 26766 28912 30744 34092 35350 42413 43692 43719 47790 48478 53011 55626 60172
1494 2617 7925 8273 10553 11716 15889 16148 20889 21300 24330 24369 25923 26003 26946 27850 32957 34336 34582 39115 40545 40803 41536 42799 43299 43399 44808 48890 49636 51086 57826
1161 1759 2367 2918 5987 7585 9094 9186 12131 17240 18626 18686 24173 24209 27846 29283 30193 30559 31588 34049 38595 39498 42911 44645 45491 45833 47117 50579 53647 54441 59786
2012 2133 2173 5371 6085 6679 9267 9697 11447 12471 14590 16406 17634 18469 21328 21810 23554 30923 32684 37256 38240 40199 43255 45922 48017 49442 53595 55011 57300 57737 58165

Embodiment 3

Code Rate (R)=2/15, Length (N)=16200, L=360
2889 3122 3208 4324 5968 7241 13215
281 923 1077 5252 6099 10309 11114
727 2413 2676 6151 6796 8945 12528

2252 2322 3093 3329 8443 12170 13748
575 2489 2944 6577 8772 11253 11657
310 1461 2482 4643 4780 6936 11970
8691 9746 10794 13582
3717 6535 12470 12752
6011 6547 7020 11746
5309 6481 10244 13824
5327 8773 8824 13343
3506 3575 9915 13609
3393 7089 11048 12816
3651 4902 6118 12048
4210 10132 13375 13377

Embodiment 4

Code Rate (R)=2/15, Length (N)=64800, L=360
615 898 1029 6129 8908 10620 13378 14359 21964 23319 26427 26690 28128 33435 36080 40697 43525 44498 50994
165 1081 1637 2913 8944 9639 11391 17341 22000 23580 32309 38495 41239 44079 47395 47460 48282 51744 52782
426 1340 1493 2261 10903 13336 14755 15244 20543 29822 35283 38846 45368 46642 46934 48242 49000 49204 53370
407 1059 1366 2004 5985 9217 9321 13576 19659 20808 30009 31094 32445 39094 39357 40651 44358 48755 49732
692 950 1444 2967 3929 6951 10157 10326 11547 13562 19634 34484 38236 42918 44685 46172 49694 50535 55109
1087 1458 1574 2335 3248 6965 17856 23454 25182 37359 37718 37768 38061 38728 39437 40710 46298 50707 51572
1098 1540 1711 7723 9549 9986 16369 19567 21185 21319 25750 32222 32463 40342 41391 43869 48372 52149 54722
514 1283 1635 6602 11333 11443 17690 21036 22936 24525 25425 27103 28733 29551 39204 42525 49200 54899 54961
357 609 1096 2954 4240 5397 8425 13974 15252 20167 20362 21623 27190 42744 47819 49096 51995 55504 55719
25 448 1501 11572 13478 24338 29198 29840 31428 33088 34724 37698 37988 38297 40482 46953 47880 53751 54943
328 1096 1262 10802 12797 16053 18038 20433 20444 25422 32992 34344 38326 41435 46802 48766 49807 52966 55751
34 790 987 5082 5788 10778 12824 18217 23278 24737 28312 34464 36765 37999 39603 40797 43237 53089 55319
226 1149 1470 3483 8949 9312 9773 13271 17804 20025 20323 30623 38575 39887 40305 46986 47223 49998 52111
1088 1091 1757 2682 5526 5716 9665 10733 12997 14440 24665 27990 30203 33173 37423 38934 40494 45418 48393
809 1278 1580 3486 4529 6117 6212 6823 7861 9244 11559 20736 30333 32450 35528 42968 44485 47149 54913
369 525 1622 2261 6454 10483 11259 16461 17031 20221 22710 25137 26622 27904 30884 31858 44121 50690 56000
423 1291 1352 7883 26107 26157 26876 27071 31515 35340 35953 36608 37795 37842 38527 41720 46206 47998 53019
540 662 1433 2828 14410 22880 24263 24802 28242 28396 35928 37214 39748 43915 44905 46590 48684 48890 55926
214 1291 1622 7311 8985 20952 22752 23261 24896 25057 28826 37074 37707 38742 46026 51116 51521 52956 54213
109 1305 1676 2594 7447 8943 14806 16462 19730 23430 24542 34300 36432 37133 41199 43942 45860 47598 48401 49407
242 388 1360 6721 14220 21029 22536 25126 32251 33182 39192 42436 44144 45252 46238 47369 47607 47695 50635 51469
199 958 1111 13661 18809 19234 21459 25221 25837 28256 36919 39031 39107 39262 43572 45018 45959 48006 52387 55811
668 1087 1451 2945 3319 12519 21248 21344 22627 22701 28152 29670 31430 32655 38533 42233 43200 44013 44459 51398
244 1133 1665 8222 8740 11285 12774 15922 20147 20978 28927 35086 40197 40583 41066 41223 42104 44650 45391 48437
5623 8050 9679 12978 15846 16049 21807 23364 27226 27758 28661 38147 46337 48141 51364 51927 55124
10369 13704 14491 18632 19430 21218 33392 36182 36722 37342 37415 46322 47449 51136 53392 54356 55108
7460 9411 11132 11739 13722 15501 25588 26463 26738 31980 31981 35002 39659 39783 41581 51358 55114
8915 15253 15264 16513 16896 18367 19110 23492 32074 33302 42443 43797 44715 47538 48515 53464 53548
5884 8910 10123 11311 13654 14207 16122 18113 23100 23784 24825 39629 46372 52454 52799 55039 55973

Embodiment 5

Code Rate (R)=3/15, Length (N)=16200, L=360
8 372 841 4522 5253 7430 8542 9822 10550 11896 11988
80 255 667 1511 3549 5239 5422 5497 7157 7854 11267
257 406 792 2916 3072 3214 3638 4090 8175 8892 9003
80 150 346 1883 6838 7818 9482 10366 10514 11468 12341
32 100 978 3493 6751 7787 8496 10170 10318 10451 12561
504 803 856 2048 6775 7631 8110 8221 8371 9443 10990
152 283 696 1164 4514 4649 7260 7370 11925 11986 12092
127 1034 1044 1842 3184 3397 5931 7577 11898 12339 12689
107 513 979 3934 4374 4658 7286 7809 8830 10804 10893
2045 2499 7197 8887 9420 9922 10132 10540 10816 11876
2932 6241 7136 7835 8541 9403 9817 11679 12377 12810
2211 2288 3937 4310 5952 6597 9692 10445 11064 11272

Embodiment 6

Code Rate (R)=3/15, Length (N)=64800, L=360
920 963 1307 2648 6529 17455 18883 19848 19909 24149 24249 38395 41589 48032 50313
297 736 744 5951 8438 9881 15522 16462 23036 25071 34915 41193 42975 43412 49612
10 223 879 4662 6400 8691 14561 16626 17408 22810 31795 32580 43639 45223 47511

629 842 1666 3150 7596 9465 12327 18649 19052 19279 29743 30197 40106 48371 51155
857 953 1116 8725 8726 10508 17112 21007 30649 32113 36962 39254 46636 49599 50099
700 894 1128 5527 6216 15123 21510 24584 29026 31416 37158 38460 42511 46932 51832
430 592 1521 3018 10430 18090 18092 18388 20017 34383 35006 38255 41700 42158 45211
91 1485 1733 11624 12969 17531 21324 23657 27148 27509 28753 35093 43352 48104 51648
18 34 117 6739 8679 11018 12163 16733 24113 25906 30605 32700 36465 40799 43359
481 1545 1644 4216 4606 6015 6609 14659 16966 18056 19137 26670 28001 30668 49061
174 1208 1387 10580 11507 13751 16344 22735 23559 26492 27672 33399 44787 44842 45992
1151 1185 1472 6727 10701 14755 15688 17441 21281 23692 23994 31366 35854 37301 43148
200 799 1583 3451 5880 7604 8194 13428 16109 18584 20463 22373 31977 47073 50087
346 843 1352 13409 17376 18233 19119 19382 20578 24183 32052 32912 43204 48539 49893
76 457 1169 13516 14520 14638 22391 25294 31067 31325 36711 44072 44854 49274 51624
759 798 1420 6661 12101 12573 13796 15510 18384 26649 30875 36856 38994 43634 49281
551 797 1000 3999 10040 11246 15793 23298 23822 38480 39209 45334 46603 46625 47633
441 875 1554 5336 25948 28842 30329 31503 39203 39673 46250 47021 48555 49229 51421
963 1470 1642 3180 3943 6513 9125 15641 17083 18876 28499 32764 42420 43922 45762
293 324 867 8803 10582 17926 19830 22497 24848 30034 34659 37721 41523 42534 47806
687 975 1356 2721 3002 3874 4119 12336 17119 21251 22482 22833 24681 26225 48514
549 951 1268 9144 11710 12623 18949 19362 22769 32603 34559 34683 36338 47140 51069
52 890 1669 3905 5670 14712 18314 22297 30328 33389 35447 35512 35516 40587 41918
656 1063 1694 3338 3793 4513 6009 7441 13393 20920 26501 27576 29623 31261 42093
425 1018 1086 9226 10024 17552 24714 24877 25853 28918 30945 31205 33103 42564 47214
32 1145 1438 4916 4945 14830 17505 19919 24118 28506 30173 31754 34230 48608 50291
559 1216 1272 2856 8703 9371 9708 16180 19127 24337 26390 36649 41105 42988 44096
362 658 1191 7769 8998 14068 15921 18471 18780 31995 32798 32864 37293 39468 44308
1136 1389 1785 8800 12541 14723 15210 15859 26569 30127 31357 32898 38760 50523 51715
44 80 1368 2010 2228 6614 6767 9275 25237 30208 39537 42041 49906 50701 51199
1522 1536 1765 3914 5350 10869 12278 12886 16379 22743 23987 26306 30966 33854 41356
212 648 709 3443 7007 7545 12484 13358 17008 20433 25862 31945 39207 39752 40313
789 1062 1431 12280 17415 18098 23729 37278 38454 38763 41039 44600 50700 51139 51696
825 1298 1391 4882 12738 17569 19177 19896 27401 37041 39181 39199 41832 43636 45775
992 1053 1485 3806 16929 18596 22017 23435 23932 30211 30390 34469 37213 46220 49646
771 850 1039 5180 7653 13547 17980 23365 25318 34374 36115 38753 42993 49696 51031
7383 14780 15959 18921 22579 28612 32038 36727 40851 41947 42707 50480
8733 9464 13148 13899 19396 22933 23039 25047 29938 33588 33796 48930
2493 12555 16706 23905 35400 36330 37065 38866 40305 43807 43917 50621
6437 11927 14542 16617 17317 17755 18832 24772 29273 31136 36925 46663
2191 3431 6288 6430 9908 13069 23014 24822 29818 39914 46010 47246

Embodiment 7

Code Rate (R)=4/15, Length (N)=16200, L=360
19 585 710 3241 3276 3648 6345 9224 9890 10841
181 494 894 2562 3201 4382 5130 5308 6493 10135
150 569 919 1427 2347 4475 7857 8904 9903
1005 1018 1025 2933 3280 3946 4049 4166 5209
420 554 778 6908 7959 8344 8462 10912 11099
231 506 859 4478 4957 7664 7731 7908 8980
179 537 979 3717 5092 6315 6883 9353 9935
147 205 830 3609 3720 4667 7441 10196 11809
60 1021 1061 1554 4918 5690 6184 7986 11296
145 719 768 2290 2919 7272 8561 9145 10233
388 590 852 1579 1698 1974 9747 10192 10255
231 343 485 1546 3155 4829 7710 10394 11336
4381 5398 5987 9123 10365 11018 11153
2381 5196 6613 6844 7357 8732 11082
1730 4599 5693 6318 7626 9231 10663

Embodiment 8

Code Rate (R)=4/15, Length (N)=64800, L=360
276 1754 1780 3597 8549 15196 26305 27003 33883 37189 41042 41849 42356
730 873 927 9310 9867 17594 21969 25106 25922 31167 35434 37742 45866
925 1202 1564 2575 2831 2951 5193 13096 18363 20592 33786 34090 40900
973 1045 1071 8545 8980 11983 18649 21323 22789 22843 26821 36720 37856
402 1038 1689 2466 2893 13474 15710 24137 29709 30451 35568 35966 46436
263 271 395 5089 5645 15488 16314 28778 29729 34350 34533 39608 45371
387 1059 1306 1955 6990 20001 24606 28167 33802 35181 38481 38688 45140
53 851 1750 3493 11415 18882 20244 23411 28715 30722 36487 38019 45416
810 1044 1772 3906 5832 16793 17333 17910 23946 29650 34190 40673 45828
97 491 948 12156 13788 24970 33774 37539 39750 39820 41195 46464 46820
192 899 1283 3732 7310 13637 13810 19005 24227 26772 31273 37665 44005
424 531 1300 4860 8983 10137 16323 16888 17933 22458 26917 27835 37931
130 279 731 3024 6378 18838 19746 21007 22825 23109 28644 32048 34667
938 1041 1482 9589 10065 11535 17477 25816 27966 35022 35025 42536
170 454 1312 5326 6765 23408 24090 26072 33037 38088 42985 46413
220 804 843 2921 4841 7760 8303 11259 21058 21276 34346 37604
676 713 832 11937 12006 12309 16329 26438 34214 37471 38179 42420

714 931 1580 6837 9824 11257 15556 26730 32053 34461 35889 45821
28 1097 1340 8767 9406 17253 29558 32857 37856 38593 41781 47101
158 722 754 14489 23851 28160 30371 30579 34963 44216 46462 47463
833 1326 1332 7032 9566 11011 21424 26827 29789 31699 32876 37498
251 504 1075 4470 7736 11242 20397 32719 34453 36571 40344 46341
330 581 868 15168 20265 26354 33624 35134 38609 44965 45209 46909
729 1643 1732 3946 4912 9615 19699 30993 33658 38712 39424 46799
546 982 1274 9264 11017 11868 15674 16277 19204 28606 39063 43331
73 1160 1196 4334 12560 13583 14703 18270 18719 19327 38985 46779
1147 1625 1759 3767 5912 11599 18561 19330 29619 33671 43346 44098
104 1507 1586 9387 17890 23532 27008 27861 30966 33579 35541 39801
1700 1746 1793 4941 7814 13746 20375 27441 30262 30392 35385 42848
183 555 1029 3090 5412 8148 19662 23312 23933 28179 29962 35514
891 908 1127 2827 4077 4376 4570 26923 27456 33699 43431 46071
404 1110 1782 6003 14452 19247 26998 30137 31404 31624 46621 47366
886 1627 1704 8193 8980 9648 10928 16267 19774 35111 38545 44735
268 380 1214 4797 5168 9109 9288 17992 21309 33210 36210 41429
572 1121 1165 6944 7114 20978 23540 25863 26190 26365 41521 44690
18 185 496 5885 6165 20468 23895 24745 31226 33680 37665 38587
289 527 1118 11275 12015 18088 22805 24679 28262 30160 34892 43212
658 926 1589 7634 16231 22193 25320 26057 26512 27498 29472 34219
337 801 1525 2023 3512 16031 26911 32719 35620 39035 43779 44316
248 534 670 6217 11430 24090 26509 28712 33073 33912 38048 39813
82 1556 1575 7879 7892 14714 22404 22773 25531 34170 38203 38254
247 313 1224 3694 14304 24033 26394 28101 37455 37859 38997 41344
790 887 1418 2811 3288 9049 9704 13303 14262 38149 40109 40477
1310 1384 1471 3716 8250 25371 26329 26997 30138 40842 41041 44921
86 288 367 1860 8713 18211 22628 22811 28342 28463 40415 45845
719 1438 1741 8258 10797 29270 29404 32096 34433 34616 36030 45597
215 1182 1364 8146 9949 10498 18603 19304 19803 23685 43304 45121
1243 1496 1537 8484 8851 16589 17665 20152 24283 28993 34274 39795
6320 6785 15841 16309 20512 25804 27421 28941 43871 44647
2207 2713 4450 12217 16506 21188 23933 28789 38099 42392
14064 14307 14599 14866 17540 18881 21065 25823 30341 36963
14259 14396 17037 26769 29219 29319 31689 33013 35631 37319
7798 10495 12868 14298 17221 23344 31908 39809 41001 41965

Embodiment 9

Code Rate (R)=5/15, Length (N)=16200, L=360
12 269 814 1651 2116 5358 5602 5786 8357
79 279 1016 5022 5046 5220 5391 8512 9422
82 117 725 1132 1344 2777 3849 6834 7685
199 287 432 2117 2797 3613 3673 4609 7296
44 796 849 4055 4151 6213 7275 9128 9204
101 745 873 1825 2875 3672 6929 8186 10620
208 345 1019 1230 3643 4057 4096 8384 10424
465 724 959 3479 4537 6162 8882 9524 9838
2 277 558 4233 4463 8523 9886 10298
331 374 705 1263 1644 7637 8708 9256
517 593 984 1134 4727 6681 7755 8719
387 683 1045 2546 2861 4011 6955 7139
47 510 595 1183 5590 5918 6862 7243
154 738 857 2313 5140 5525 9064 9831
249 349 608 1710 2233 2767 4908 7661
1829 7205 7917 7922 8024 8809
1584 2122 4193 5053 7248 10474
2186 4334 5449 6138 6212 7280

Embodiment 10

Code Rate (R)=5/15, Length (N)=64800, L=360
221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639

506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552

Embodiment 11

Code Rate (R)=6/15, Length (N)=16200, L=360
15 593 1066 1714 5358 6168 7077 7979
339 731 769 1399 4678 7100 8114 8696
247 344 510 5273 5668 6136 8569 9147
21 283 521 4055 4548 4957 6557 7718
3 110 880 1410 4143 8297 9105 9115
2 559 636 1934 2947 3765 4060 5072
741 754 1040 1827 2112 3338 4693 6498
213 338 775 2464 2974 3852 4353 4787
211 428 432 2439 2694 4541 6025 8071
28 239 855 2060 3791 7217 8722
407 555 814 2635 3037 4619 8473
203 846 988 2599 4890 7749 9671
641 682 801 2577 4612 4916 5286
111 577 728 2998 4109 5547 8002
197 391 480 1526 9016 9434 9447
382 446 546 3865 6824 7752 8076
307 321 1031 4476 7858 8463 9604
112 252 446 1665 2189 4869 5570
4566 6695 7966 8371 9608
2490 3419 6716 9038 9232
1117 1203 6031 7193 7320

Embodiment 12

Code Rate (R)=6/15, Length (N)=64800, L=360
71 276 856 6867 12964 17373 18159 26420 28460 28477
257 322 672 2533 5316 6578 9037 10231 13845 36497
233 765 904 1366 3875 13145 15409 18620 23910 30825
100 224 405 12776 13868 14787 16781 23886 29099 31419
23 496 891 2512 12589 14074 19392 20339 27658 28684
473 712 759 1283 4374 9898 12551 13814 24242 32728
511 567 815 11823 17106 17900 19338 22315 24396 26448
45 733 836 1923 3727 17468 25746 33806 35995 36657
17 487 675 2670 3922 5145 18009 23993 31073 36624
72 751 773 1937 17324 28512 30666 30934 31016 31849
257 343 594 14041 19141 24914 26864 28809 32055 34753

99 241 491 2650 9670 17433 17785 18988 22235 30742
198 299 655 6737 8304 10917 16092 19387 20755 37690
351 916 926 18151 21708 23216 30321 33578 34052 37949
54 332 373 2010 3332 5623 16301 34337 36451 37861
139 257 1068 11090 20289 29694 29732 32640 35133 36404
457 885 968 2115 4956 5422 5949 17570 26673 32387
137 570 619 5006 6099 7979 14429 16650 25443 32789
46 282 287 10258 18383 20258 27186 27494 28429 38266
445 486 1058 1868 9976 11294 20364 23695 30826 35330
134 900 931 12518 14544 17715 19623 21111 33868 34570
62 66 586 8020 20270 23831 31041 31965 32224 35189
174 290 784 6740 14673 17642 26286 27382 33447 34879
332 675 1033 1838 12004 15439 20765 31721 34225 38863
527 558 832 3867 6318 8317 10883 13466 18427 25377
431 780 1021 1112 2873 7675 13059 17793 20570 20771
339 536 1015 5725 6916 10846 14487 21156 28123 32614
456 830 1078 7511 11801 12362 12705 17401 28867 34032
222 538 989 5593 6022 8302 14008 23445 25127 29022
37 393 788 3025 7768 11367 22276 22761 28232 30394
234 257 1045 1307 2908 6337 26530 28142 34129 35997
35 46 978 9912 9978 12567 17843 24194 34887 35206
39 959 967 5027 10847 14657 18859 28075 28214 36325
275 477 823 11376 18073 28997 30521 31661 31941 32116
185 580 966 11733 12013 12760 13358 19372 32534 35504
760 891 1046 11150 20358 21638 29930 31014 33050 34840
360 389 1057 5316 5938 14186 16404 32445 34021 35722
306 344 679 5224 6674 10305 18753 25583 30585 36943
103 171 1016 8780 11741 12144 19470 20955 22495 27377
818 832 894 3883 14279 14497 22505 28129 28719 31246
215 411 760 5886 25612 28556 32213 32704 35901 36130
229 489 1067 2385 8587 20565 23431 28102 30147 32859
288 664 980 8138 8531 21676 23787 26708 28798 34490
89 552 847 6656 9889 23949 26226 27080 31236 35823
66 142 443 3339 3813 7977 14944 15464 19186 25983
605 876 931 16682 17669 25800 28220 33432 35738 37382
346 423 806 5669 7668 8789 9928 19724 24039 27893
48 460 1055 3512 7389 7549 20216 22180 28221 35437
187 636 824 1678 4508 13588 19683 21750 30311 33480
25 768 935 2856 8187 9052 21850 29941 33217 34293
349 624 716 2698 6395 6435 8974 10649 15932 17378
336 410 871 3582 9830 10885 13892 18027 19203 36659
176 849 1078 17302 19379 27964 28164 28720 32557 35495
234 890 1075 9431 9605 9700 10113 11332 12679 24268
516 638 733 8851 19871 22740 25791 30152 32659 35568
253 830 879 2086 16885 22952 23765 25389 34656 37293
94 954 998 2003 3369 6870 7321 29856 31373 34888
79 350 933 4853 6252 11932 12058 21631 24552 24876
246 647 778 4036 10391 10656 13194 32335 32360 34179
149 339 436 6971 8356 8715 11577 22376 28684 31249
36 149 220 6936 18408 19192 19288 23063 28411 35312
273 683 1042 6327 10011 18041 21704 29097 30791 31425
46 138 722 2701 10984 13002 19930 26625 28458 28965
12 1009 1040 1990 2930 5302 21215 22625 23011 29288
125 241 819 2245 3199 8415 21133 26786 27226 38838
45 476 1075 7393 15141 20414 31244 33336 35004 38391
432 578 667 1343 10466 11314 11507 23314 27720 34465
248 291 556 1971 3989 8992 18000 19998 23932 34652
68 694 837 2246 7472 7873 11078 12868 20937 35591
272 924 949 2030 4360 6203 9737 19705 19902 38039
21 314 979 2311 2632 4109 19527 21920 31413 34277
197 253 804 1249 4315 10021 14358 20559 27099 30525
9802 16164 17499 22378 22403 22704 26742 29908
9064 10904 12305 14057 16156 26000 32613 34536
5178 6319 10239 19343 25628 30577 31110 32291

Embodiment 13

Code Rate (R)=7/15, Length (N)=16200, L=360
56 330 835 1133 1731 2171 5077 7762
21 259 845 1827 2503 3258 7361 7490
105 779 1069 1366 7074 7251 7294 7514
16 558 923 2455 4076 6294 7507 8475
37 197 384 2184 2223 6347 6525 7258
197 393 844 1961 3881 5842 6368 8032
374 588 1069 3093 4484 5868 7320
243 767 790 1603 1867 4804 7416
0 242 730 2141 4235 4642 5063
148 327 431 2291 3847 5133 7977
110 864 925 2730 4227 6604 7219
571 746 867 1384 3974 5944 6713
268 347 948 1515 3629 5598 7538
876 904 1049 4249 5198 6938 7701
690 748 782 1304 2117 4528 4589
14 300 703 2968 4571 6102 7754
832 998 1071 2591 3865 4812 6321
458 903 976 5179 5520 6862 8068
155 358 984 1417 1602 2697 3044
312 701 784 1636 2183 3501 5170
85 981 989 2893 2951 4457 4685
5091 5244 5293 5404 6009
2171 2203 2344 3255 6338
3072 4338 6965 7045 8061

Embodiment 14

Code Rate (R)=7/15, Length (N)=64800, L=360
460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252

297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2488 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11452 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655
109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031
507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281
683 709 1032 3787 17623 24138 26775 31432 33626
524 792 1042 12249 14765 18601 25811 32422 33163
137 639 688 7182 8169 10443 22530 24597 29039
159 643 749 16386 17401 24135 28429 33468 33469
107 481 555 7322 13234 19344 23498 26581 31378
249 389 523 3421 10150 17616 19085 20545 32069
395 738 1045 2415 3005 3820 19541 23543 31068
27 293 703 1717 3460 8326 8501 10290 32625
126 247 515 6031 9549 10643 22067 29490 34450
331 471 1007 3020 3922 7580 23358 28620 30946
222 542 1021 3291 3652 13130 16349 33009 34348
532 719 1038 5891 7528 23252 25472 31395 31774
145 398 774 7816 13887 14936 23708 31712 33160
88 536 600 1239 1887 12195 13782 16726 27998
151 269 585 1445 3178 3970 15568 20358 21051
650 819 865 15567 18546 25571 32038 33350 33620
93 469 800 6059 10405 12296 17515 21354 22231
97 206 951 6161 16376 27022 29192 30190 30665
412 549 986 5833 10583 10766 24946 28878 31937
72 604 659 5267 12227 21714 32120 33472 33974
25 902 912 1137 2975 9642 11598 25919 28278
420 976 1055 8473 11512 20198 21662 25443 30119
1 24 932 6426 11899 13217 13935 16548 29737
53 618 988 6280 7267 11676 13575 15532 25787
111 739 809 8133 12717 12741 20253 20608 27850
120 683 943 14496 15162 15440 18660 27543 32404
600 754 1055 7873 9679 17351 27268 33508
344 756 1054 7102 7193 22903 24720 27883
582 1003 1046 11344 23756 27497 27977 32853
28 429 509 11106 11767 12729 13100 31792
131 555 907 5113 10259 10300 20580 23029
406 915 977 12244 20259 26616 27899 32228
46 195 224 1229 4116 10263 13608 17830
19 819 953 7965 9998 13959 30580 30754
164 1003 1032 12920 15975 16582 22624 27357
8433 11894 13531 17675 25889 31384
3166 3813 8596 10368 25104 29584
2466 8241 12424 13376 24837 32711

Embodiment 15

Code Rate (R)=5/15, Length (N)=16200, L=360
69 244 706 5145 5994 6066 6763 6815 8509
257 541 618 3933 6188 7048 7484 8424 9104
69 500 536 1494 1669 7075 7553 8202 10305
11 189 340 2103 3199 6775 7471 7918 10530
333 400 434 1806 3264 5693 8534 9274 10344
111 129 260 3562 3676 3680 3809 5169 7308 8280
100 303 342 3133 3952 4226 4713 5053 5717 9931
83 87 374 828 2460 4943 6311 8657 9272 9571
114 166 325 2680 4698 7703 7886 8791 9978 10684
281 542 549 1671 3178 3955 7153 7432 9052 10219
202 271 608 3860 4173 4203 5169 6871 8113 9757
16 359 419 3333 4198 4737 6170 7987 9573 10095
235 244 584 4640 5007 5563 6029 6816 7678 9968
123 449 646 2460 3845 4161 6610 7245 7686 8651
136 231 468 835 2622 3292 5158 5294 6584 9926
3085 4683 8191 9027 9922 9928 10550
2462 3185 3976 4091 8089 8772 9342

In the embodiments, the rows of a sequence are distinguished from each other by respective indentations. That is, each row of a sequence starts with an indentation in the embodiments.

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j=0 \text{ for } j=0,1,\ldots,M_1+M_2-1 \quad (4)$$

First information bit $\lambda_0$ is accumulated at parity bit addresses specified in the 1st row of the sequence of the Embodiments 1 through 15. For example, in an LDPC code having a length of 64800 and a code rate of 3/15, an accumulation process is as follows:

$p_{920}=p_{920}\oplus\lambda_0$    $p_{963}=p_{963}\oplus\lambda_0$    $p_{1307}=p_{1307}\oplus\lambda_0$
$p_{2648}=p_{2648}\oplus\lambda_0$    $p_{6529}=p_{6529}\oplus\lambda_0$    $p_{17455}=p_{17455}\oplus\lambda_0$
$p_{18883}=p_{18883}\oplus\lambda_0$    $p_{19848}=p_{19848}\oplus\lambda_0$    $p_{19909}=p_{19909}\oplus\lambda_0$
$p_{24149}=p_{24149}\oplus\lambda_0$    $p_{24249}=p_{24249}\oplus\lambda_0$    $p_{38395}=p_{38395}\oplus\lambda_0$
$p_{41589}=p_{41589}\oplus\lambda_0$    $p_{48032}=p_{48032}\oplus\lambda_0$    $p_{50313}=p_{50313}\oplus\lambda_0$ where the addition $\oplus$ occurs in GF(2).

The subsequent L−1 information bits, that is, $\lambda_m$, m=1, 2, ..., L−1, are accumulated at parity bit addresses that are calculated by the following Equation 5:

$$(x+m \times Q_1) \bmod M_1 \text{ if } x<M_1$$

$$M_1+\{(x-M_1+m \times Q_2) \bmod M_2\} \text{ if } x \geq M_1 \quad (5)$$

where x denotes the addresses of parity bits corresponding to the first information bit $\lambda_0$, that is, the addresses of the parity bits specified in the first row of the sequence of the Embodiments 1 through 15, $Q_1=M_1/L$, $Q_2=M_2/L$, and $L=360$. Furthermore, $Q_1$ and $Q_2$ are defined in the following Table 2. For example, for an LDPC code having a length of 64800 and a code rate of 3/15, $M_1=1800$, $Q_1=5$, $M_2=50040$, $Q_2=139$ and $L=360$, and the following operations are performed on the second bit $\lambda_1$ using Equation 5:

$p_{925}=p_{925}\oplus\lambda_1$  $p_{968}=p_{968}\oplus\lambda_1$  $p_{1312}=p_{1312}\oplus\lambda_1$
$p_{2787}=p_{2787}\oplus\lambda_1$  $p_{6668}=p_{6668}\oplus\lambda_1$  $p_{17594}=p_{17594}\oplus\lambda_1$
$p_{19022}=p_{19022}\oplus\lambda_1$  $p_{19987}=p_{19987}\oplus\lambda_1$  $p_{20048}=p_{20048}\oplus\lambda_1$
$p_{24288}=p_{24288}\oplus\lambda_1$  $p_{24388}=p_{24388}\oplus\lambda_1$  $p_{38534}=p_{38534}\oplus\lambda_1$
$p_{41728}=p_{41728}\oplus\lambda_1$  $p_{48171}=p_{48171}\oplus\lambda_1$  $p_{50452}=p_{50452}\oplus\lambda_1$ Table 2 illustrates the sizes of $M_1$, $Q_1$, $M_2$ and $Q_2$ of the designed QC-LDPC code:

TABLE 2

| Rate | Length | $M_1$ | $M_2$ | $Q_1$ | $Q_2$ |
|---|---|---|---|---|---|
| 1/15 | 16200 | 2520 | 12600 | 7 | 35 |
|  | 64800 | 1080 | 59400 | 3 | 165 |
| 2/15 | 16200 | 3240 | 10800 | 9 | 30 |
|  | 64800 | 1800 | 54360 | 5 | 151 |
| 3/15 | 16200 | 1080 | 11880 | 3 | 33 |
|  | 64800 | 1800 | 50040 | 5 | 139 |
| 4/15 | 16200 | 1080 | 10800 | 3 | 30 |
|  | 64800 | 1800 | 45720 | 5 | 127 |
| 5/15 | A  16200 | 1080 | 9720 | 3 | 27 |
|  | B  16200 | 720 | 10080 | 2 | 28 |
|  | 64800 | 1440 | 41760 | 4 | 116 |
| 6/15 | 16200 | 1080 | 8640 | 3 | 24 |
|  | 64800 | 1080 | 37800 | 3 | 105 |
| 7/15 | 16200 | 1080 | 7560 | 3 | 21 |
|  | 64800 | 1080 | 33480 | 3 | 93 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i=p_i\oplus p_{i-1} \text{ for } i=0,1,\ldots,M_1-1 \quad (6)$$

Thereafter, when a parity interleaving operation, such as that of the following Equation 7, is performed, parity bits corresponding to the dual diagonal matrix B are generated:

$$\lambda_{K+L\cdot t+s}=p_{Q_1\cdot s+t} \text{ for } 0\leq s<L, 0\leq t<Q_1 \quad (7)$$

When the parity bits corresponding to the dual diagonal matrix B have been generated using K information bits $\lambda_0$, $\lambda_1,\ldots,\lambda_{K-1}$, parity bits corresponding to the identity matrix D are generated using the $M_1$ generated parity bits $\lambda_K$, $\lambda_{K+1},\ldots,\lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L\cdot t+s}=p_{M_1+Q_2\cdot s+t} \text{ for } 0\leq s<L, 0\leq t<Q_2 \quad (8)$$

Figure 4:
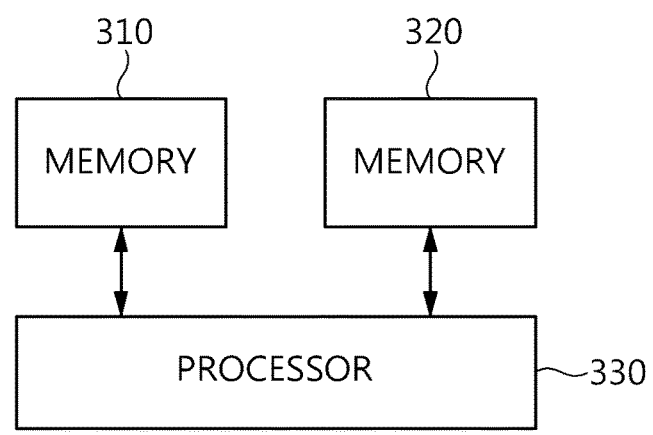
FIG. 4 is a block diagram illustrating an LDPC encoder according to an embodiment of the present invention.

FIG. 4 is a block diagram illustrating an LDPC encoder according to an embodiment of the present invention.

Referring to FIG. 4, the LDPC encoder according to this embodiment of the present invention includes memory 310 and 320 and a processor 330.

The memory 310 is memory that is used to store an LDPC codeword.

The memory 320 is memory that is initialized to 0.

The memory 310 and the memory 320 may correspond to $\lambda_i$ (i=0, 1, . . . , N−1) and $p_j$ (j=0, 1, . . . , $M_1+M_2-1$), respectively.

The memory 310 and the memory 320 may correspond to various types of hardware for storing sets of bits, and may correspond to data structures, such as an array, a list, a stack and a queue.

The processor 330 generates an LDPC codeword by performing accumulation with respect to the memory 320 using information bits.

In this case, the accumulation may be performed at parity bit addresses that are updated using the sequence corresponding to a PCM.

In this case, the LDPC codeword may include a systematic part $\lambda_0, \lambda_1, \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the memory 320 may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}$, $\lambda_{K+M_1+M_2-1}, \ldots, \lambda_{K+M_1+M_2-1}$ may be generated by performing parity interleaving using the memory 310 and the memory 320 as described in conjunction with Equation 8 after the accumulation using the first parity part $\lambda_K$, $\lambda_{K+1}, \ldots, \lambda_{K+M_1-1}$, which is generated by the parity interleaving of Equation 7, and the sequence.

FIG. 5 is a block diagram illustrating an LDPC decoder according to an embodiment of the present invention.

Referring to FIG. 5, the LDPC decoder according to this embodiment of the present invention may include a receiving unit 410 and a decoding unit 420.

The receiving unit 410 receives an LDPC codeword that has been encoded using a sequence that corresponds to a PCM.

The decoding unit 420 restores information bits from the received LDPC codeword by performing decoding corresponding to the PCM.

In this case, the sequence may be used to update the parity bit addresses of the memory, and the parity bit addresses are used for accumulation that is performed to generate parity bits corresponding to the LDPC codeword.

In this case, the LDPC codeword may include a systematic part $\lambda_0, \lambda_1 \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

FIG. 6 is an operation flowchart illustrating an LDPC encoding method according to an embodiment of the present invention.

Referring to FIG. 6, the LDPC encoding method according to this embodiment of the present invention initializes the first and second memory that stores an LDPC codeword at step S510.

In this case, step S510 may be performed using Equation 4.

Furthermore, in the LDPC encoding method according to this embodiment of the present invention, an LDPC codeword is generated by performing accumulation with respect to the second memory using information bits at step S520.

In this case, the accumulation may be performed at parity bit addresses that are updated using the sequence corresponding to the PCM.

In this case, the LDPC codeword may include a systematic part $\lambda_0, \lambda_1, \ldots, \lambda_{K-1}$ corresponding to the information bits, a first parity part corresponding to a dual diagonal matrix included in the PCM, and a second parity part $\lambda_{K+M_1}, \lambda_{K+M_1+1}, \ldots, \lambda_{K+M_1+M_2-1}$ corresponding to an identity matrix included in the PCM.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1+1}, \ldots, \lambda_{K+M_1\pm M_2-1}$ may be generated by performing parity interleaving using the memory 310 and the memory 320 as described in conjunction with Equation 8 after the accumulation performed using the first parity part $\lambda_K, \lambda_{K+1}, \ldots, \lambda_{K+M_1-1}$, which is generated by the parity interleaving of Equation 7, and the sequence.

Figure 7:
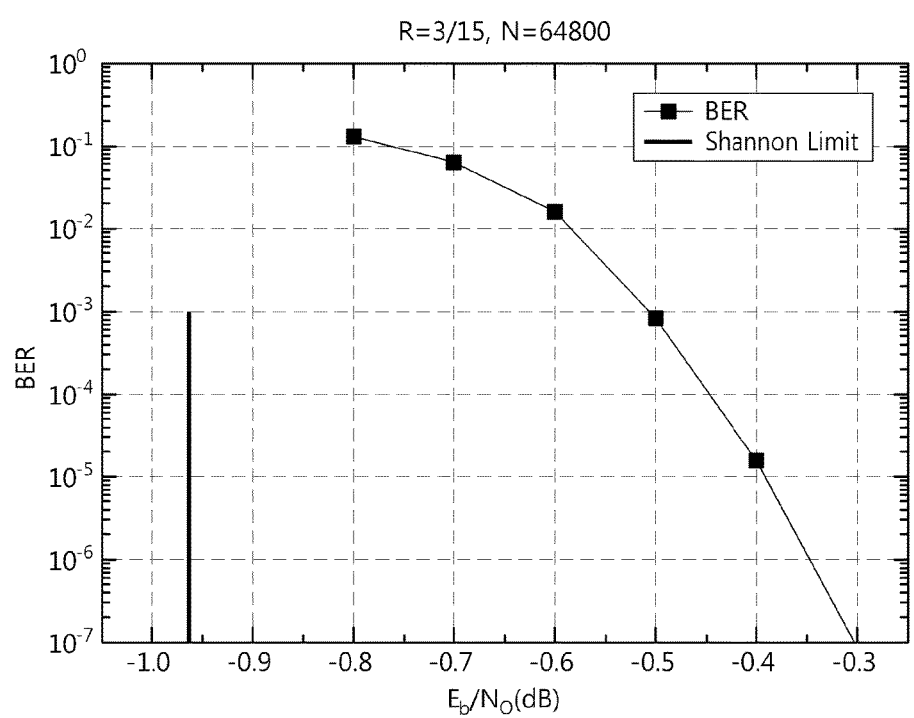
FIG. 7 is a graph plotting the performance of a QC-LDPC code having a length of 64800 and a code rate of 3/15 according to an embodiment of the present invention against $E_b/N_o$.

FIG. 7 is a graph plotting the performance of a QC-LDPC code having a length of 64800 and a code rate of 3/15 according to an embodiment of the present invention against $E_b/N_o$.

The graph illustrated in FIG. 7 illustrates results that were obtained on the assumption that a log-likelihood ratio (LLR)-based sum-product algorithm in which binary phase shift keying (BPSK) modulation and 50 rounds of repetitive decoding were performed was used for computational experiments. As illustrated in FIG. 7, it can be seen that the designed code is away from the Shannon limit by about 0.6 dB at BER=$10^{-6}$.

At least one embodiment of the present invention has an advantage of providing a new LDPC codeword having a length of 64800 or 16200, which is capable of being used in next generation terrestrial broadcasting for general purposes.

At least one embodiment of the present invention has an advantage of providing a technology that is capable of efficiently updating parity bit addresses when generating the parity bits of an LDPC codeword through accumulation using a sequence corresponding to a PCM.

At least one embodiment of the present invention has an advantage of providing a technology that is capable of updating parity bit addresses based on the results of comparing previous parity bit addresses with the size of a parity part corresponding to dual diagonal matrix included in a PCM when generating the parity bits of an LDPC codeword through accumulation using a sequence corresponding to a PCM, thereby improving the efficiency of LDPC encoding.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A method of transmitting a broadcast signal, which is performed by a transmission device, the method comprising:
    initializing first memory configured to store an LDPC codeword, and second memory;
    generating the LDPC codeword by performing accumulation with respect to the second memory using information bits; and
    transmitting a broadcast signal corresponding to the LDPC codeword to a reception device,
    wherein the accumulation is performed at parity bit addresses that are updated using a sequence corresponding to a parity check matrix (PCM), and
    wherein the parity bit addresses are updated in accordance with the following equation:

$(x+m \times Q_1) \bmod M_1$ if $x < M_1$ $M_1 + \{(x - M_1 + m \times Q_2) \bmod M_2\}$ if $x \geq M_1$ where x denotes previous parity bit addresses, m is an information bit index that is an integer larger than 0 and smaller than L, L is a bit-size of a circulant permutation matrix (CPM) of the PCM, $Q_1$ is $M_1/L$, $M_1$ is a size of a first parity part, $Q_2$ is $M_2/L$, and $M_2$ is a size of a second parity part, thereby correcting errors occurring over a physical channel.

2. The method of claim 1, wherein the parity bit addresses are updated based on results of comparing each of the previous parity bit addresses specified in each row of the sequence with the size of the first parity part.

3. The method of claim 1, wherein the LDPC codeword comprises a systematic part corresponding to the information bits, the first parity part corresponding to a dual diagonal matrix included in the PCM, and the second parity part corresponding to an identity matrix included in the PCM.

4. The method of claim 3, wherein the second memory has a size corresponding to a sum of the size of the first parity part and the size of the second parity part.

5. The method of claim 4, wherein the accumulation is performed while the rows of the sequence are being repeatedly changed by the bit-size of the CPM of the PCM.

6. The method of claim 5, wherein the first parity part is generated by performing parity interleaving using the first and second memory.

* * * * *